US006453276B1

(12) United States Patent
Bauman

(10) Patent No.: US 6,453,276 B1
(45) Date of Patent: Sep. 17, 2002

(54) METHOD AND APPARATUS FOR EFFICIENTLY GENERATING TEST INPUT FOR A LOGIC SIMULATOR

(75) Inventor: Mitchell A. Bauman, Circle Pines, MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/218,384

(22) Filed: Dec. 22, 1998

(51) Int. Cl.[7] .......................... G06F 17/50; G06F 9/455
(52) U.S. Cl. ............................................. 703/15; 716/4
(58) Field of Search ...................... 703/13–16; 702/116; 716/2–4; 714/348

(56) References Cited

U.S. PATENT DOCUMENTS

| | | | | |
|---|---|---|---|---|
| 5,402,358 A | * | 3/1995 | Smith et al. ..................... | 716/9 |
| 5,600,579 A | * | 2/1997 | Steinmetz, Jr. ............... | 703/13 |
| 5,610,833 A | * | 3/1997 | Chang et al. .................. | 716/11 |
| 5,802,075 A | * | 9/1998 | Carpenter et al. ........... | 714/738 |
| 5,893,123 A | * | 4/1999 | Tuinenga ..................... | 707/504 |
| 5,903,576 A | * | 5/1999 | Yoshiba ....................... | 714/720 |
| 5,920,490 A | * | 7/1999 | Peters ........................... | 716/2 |
| 5,946,211 A | * | 8/1999 | Glover ........................... | 703/4 |
| 6,049,901 A | * | 4/2000 | Stock et al. ................. | 714/726 |
| 6,073,263 A | * | 6/2000 | Akin et al. .................. | 714/738 |
| 6,167,364 A | * | 12/2000 | Stellenberg et al. .......... | 703/14 |

OTHER PUBLICATIONS

Chang et al., "IPDA: Interconnect Performance Design Assistant", Proc. 29th ACM/IEEE Design Automation Conference, pp. 472–477, Jun. 1992.*
Pardey et al., "Logic Synthesis of Synchronous Parallel Controllers", Proceeings 1991 IEEE International Conference on Computer Design, pp. 454–457, Oct. 1991.*
Shaikh et al., "Eploiting Component/Event–level Parallelism in Concurrent Fault and Design Error Simulation", Proc. 30th Simulation Symp., pp. 64–74, Apr. 1997.*
Lallo, P., "Investigation of Data Transmission Over an Adaptive Delta Modulated Voice Channel by Simulations Using a Sspreadsheet Program", Proc. MILCOM 97, vol. 2, pp. 554–559, Nov. 1997.*
Henderson et al, "A Spreadsheet Interface for Analog Design Knowledge Capture and Re–Use", Proc. IEEE 1993 Custom IC Conf. pp. 13.3.1–13.3.4, May 1993.*
Baudin et al., "From Spreadsheelts to Simulations: A Comparison of Analysis Methods for IC Manufacturing Performance", IEEE/SEMI Inter. Semiconductor Man. Sc. Symp.,—94–99, Jun. 1992.*
El–Hajj et al., "Simulation of a Class of Integrated Circuits using Spreadsheets", IEE Proc. Circuits, Devices and Systems, pp. 607–610, Oct. 1992.*
Subramanian et al., "Study of Multilevel Appraoch to Partitioning for Parallel Logic Simulation", Proc. 14th Inter. Parallel and Distributed Processing Symp., pp. 833–838, May 2000.*
Gil et al., "Parallel Test Generation using Circuit Partioning and Spectral Techniques", Proc. 6th Euromicro Workshop on Parallel and Dist. Processing, pp. 264–270, Jan. 1998.*
Krishnaswamy et al., "SPITFIRE: Scalable Parallel Algorithm for Test Set Paritioned Fault Simulation", 15th IEEE VLSI Test Symposium, pp. 274–281, May 1997.*

* cited by examiner

Primary Examiner—Russell Frejd
(74) Attorney, Agent, or Firm—Charles A. Johnson; Mark T. Starr; Crompton, Seager and Tufte, LLC

(57) ABSTRACT

A method and apparatus for generating test input for a logic simulator by providing a template that allows a test designer to more efficiently enter the desired test conditions. The template is preferably arranged to facilitate the definition of test cases, and in particular, parallel type test cases. One region of the template is preferably dedicated to one section of a circuit design, and another region is dedicated to another section of the circuit design. When the regions are positioned side-by-side, for example, the test designer can easily identify the test conditions that are applied to the various circuit sections, including the relationships therebetween. Once the test conditions are entered, the template is processed and the desired test input is automatically generated.

20 Claims, 15 Drawing Sheets

Header:
Description:
Revision History
MSU Address
MSU Data Inc:
PD Mask Ditto:
MSU Response:
Test:

*FIG. 5*

```
/*******************************************************************
*/
/*
        Horizon MSU Testcase:    test1

Test title text,

Author:  Name
Date:
*/
/*******************************************************************
*/
/*
Test Description:
Test Description in text

*/
/*******************************************************************
*/
/*
Revision History:

MAB - History text of test

*/
/*******************************************************************
*/
#include <stdlib.h>
#include <stdio.h>
#include <string.h>
#define MSU_DEFINES 1
#include "/vobs/aurora/src/link_to_pdc-rel"
main(int argc, char *argv[])
{
    char source_dir[60];
    int  msu_config, mda_present;
int    P0_stat_D0;
int    P0_data_D0;
int    P1_stat_D0;
int    P1_data_D0;
int    P2_stat_D0;
int    P2_data_D0;
int    P3_stat_D0;
int    P3_data_D0;
int    P0_stat_D1;
int    P0_data_D1;
int    P1_stat_D1;
int    P1_data_D1;
int    P2_stat_D1;
int    P2_data_D1;
int    P3_stat_D1;
```

| FIG. 8A |
|---|
| FIG. 8B |
| FIG. 8C |
| FIG. 8D |
| FIG. 8E |
| FIG. 8F |

FIG. 8A

```
int    P3_data_D1;
int    P0_stat_D2;
int    P0_data_D2;
int    P1_stat_D2;
int    P1_data_D2;
int    P2_stat_D2;
int    P2_data_D2;
int    P3_stat_D2;
int    P3_data_D2;
int    P0_mask_M0;
int    P1_mask_M0;
int    P2_mask_M0;
int    P3_mask_M0;
open_test(POD_MSU, "msu_lte_tst", "test1", argc, argv);
pd_comment("Test test1 : Test title text");

/* Checks for which of the supported configuarations is       */
/* specified and sets variables to record and use this info.  */
/* Based on this config a string is preloaded with the directory*/
/* tree to get to the test data files for loading vmem.       */
/* This directory is: $MSUSIM/tests/<alias_name>/             */ if( strcmp( hvl_get_alias(), "test1_mlt") == 0 )          /* if msu
lite config */
    {
        msu_config = 0;
        mda_present = 0x1;
        strcpy(source_dir,"exec cp $env(MSUSIM)/tests/test1_mlt/");
    }
    else if( strcmp( hvl_get_alias(), "test1_mft") == 0 )     /* if
msu full config */
    {
        msu_config = 1;
        mda_present = 0xf;
        strcpy(source_dir,"exec cp $env(MSUSIM)/tests/test1_mft/");
    }
    else
    {
        printf("\n\n    Error: Incorrect alias entered on compile
command line\n\n");
        return 0;
    }

/* DUT RAM DEFINITION AND INIT: */

/* DUT INIT: */
```

*FIG. 8B*

```
/* PPD initialization                                              */
/* Assumes RPCD being used.  Assumes all four PPD's present. */
    init_dut( SOFT,":ppd0_rcpd_present",1 );
    init_dut( SOFT,":ppd0_mda_present",mda_present );
    init_dut( SOFT,":ppd0_sel_nak",0 );
    init_dut( SOFT,":ppd0_hold_parb",1 );
    init_dut( SOFT,":ppd0_cachdisable",0 );
    init_dut( SOFT,":ppd0_randmode_msg",0 );
    init_dut( SOFT,":ppd0_dis_auto_ret",0 );

init_dut( SOFT,":ppd1_rcpd_present",1 );
    init_dut( SOFT,":ppd1_mda_present",mda_present );
    init_dut( SOFT,":ppd1_sel_nak",0 );
    init_dut( SOFT,":ppd1_hold_parb",1 );
    init_dut( SOFT,":ppd1_cachdisable",0 );
    init_dut( SOFT,":ppd1_randmode_msg",0 );
    init_dut( SOFT,":ppd1_dis_auto_ret",0 );

init_dut( SOFT,":ppd2_rcpd_present",1 );
    init_dut( SOFT,":ppd2_mda_present",mda_present );
    init_dut( SOFT,":ppd2_sel_nak",0 );
    init_dut( SOFT,":ppd2_hold_parb",1 );
    init_dut( SOFT,":ppd2_cachdisable",0 );
    init_dut( SOFT,":ppd2_randmode_msg",0 );
    init_dut( SOFT,":ppd2_dis_auto_ret",0 );

init_dut( SOFT,":ppd3_rcpd_present",1 );
    init_dut( SOFT,":ppd3_mda_present",mda_present );
    init_dut( SOFT,":ppd3_sel_nak",0 );
    init_dut( SOFT,":ppd3_hold_parb",1 );
    init_dut( SOFT,":ppd3_cachdisable",0 );
    init_dut( SOFT,":ppd3_randmode_msg",0 );
    init_dut( SOFT,":ppd3_dis_auto_ret",0 );

/* Start a refresh cycle at the start of the test on the specified
address bus */
/* Leave commented out unless you want to use refresh.
      */
/*    MSU_REFRESH_SEQ_INIT(0) */

/* ----------------------------------------------------------------- */

/* MSU INIT: */

/* GENERATE ANY NEEDED CACHE LINES FOR THE MSU
*/
/*
msu_init(ecc_corupt,mda_mask,error,DS_data,bnksel,adr_bus,ar,cs,ras,cas,
                    */
/*              data0a, data0b, data1a, data1b, data2a, data2b,
data3a, data3b,                   */
/*          data4a, data4b, data5a, data5b, data6a, data6b, data7a,
data7b);                   */
```

FIG. 8C

```
/*
msu_init_inc(ecc_corupt,mda_mask,error,DS_data,bnksel,adr_bus,ar,cs,ras,
cas,data,inc);           */
/* Using a mda_mask of 0xf will generate data that is valid for both the
lte and mft congurations.    */
/*                An example using the defined constants is below:
*/
/*
msu_init_inc(0x0,0xf,0x0000,0x0ec,BNK0,ADRB0,AR0,CS0,0x000,0x0a0,0x0a000
a00,0x00010001);           */
msu_init_inc(0x0, 0xf, 0x0000,
0x0,1,0,0,0,0x000,0x0a0,0x0aaaaaa0,0x00010001);
msu_init_inc(0x0, 0xf, 0x0000,
0x0,0,0,1,0,0x000,0x0b0,0x0bbbbbb0,0x00010001);
msu_init_inc(0x0, 0xf, 0x0000,
0x0,0,1,0,0,0x000,0x0a0,0x0cccccc0,0x00010001);

/*------------------------------------------------------------------ */
/* Port Driver  data and data status initialization */
/*------------------------------------------------------------------ */ pd(POD_MSU,0); /*POD_MSU Port Driver 0 */
   P0_data_D0 = dr_inc( 0x0aaaaaa0, 0x00010001 );
   P0_stat_D0 = msu_inc_data_stat( 0x0aaaaaa0, 0x00010001 , 0, 0 );
   P0_data_D1 = dr_inc( 0x0bbbbbb0, 0x00010001 );
   P0_stat_D1 = msu_inc_data_stat( 0x0bbbbbb0, 0x00010001 , 0, 0 );
   P0_data_D2 = dr_inc( 0x0cccccc0, 0x00010001 );
   P0_stat_D2 = msu_inc_data_stat( 0x0cccccc0, 0x00010001 , 0, 0 );
pd(POD_MSU,1); /*POD_MSU Port Driver 1 */
   P1_data_D0 = dr_inc( 0x0aaaaaa0, 0x00010001 );
   P1_stat_D0 = msu_inc_data_stat( 0x0aaaaaa0, 0x00010001 , 0, 0 );
   P1_data_D1 = dr_inc( 0x0bbbbbb0, 0x00010001 );
   P1_stat_D1 = msu_inc_data_stat( 0x0bbbbbb0, 0x00010001 , 0, 0 );
   P1_data_D2 = dr_inc( 0x0cccccc0, 0x00010001 );
   P1_stat_D2 = msu_inc_data_stat( 0x0cccccc0, 0x00010001 , 0, 0 );
pd(POD_MSU,2); /*POD_MSU Port Driver 2 */
   P2_data_D0 = dr_inc( 0x0aaaaaa0, 0x00010001 );
   P2_stat_D0 = msu_inc_data_stat( 0x0aaaaaa0, 0x00010001 , 0, 0 );
   P2_data_D1 = dr_inc( 0x0bbbbbb0, 0x00010001 );
   P2_stat_D1 = msu_inc_data_stat( 0x0bbbbbb0, 0x00010001 , 0, 0 );
   P2_data_D2 = dr_inc( 0x0cccccc0, 0x00010001 );
   P2_stat_D2 = msu_inc_data_stat( 0x0cccccc0, 0x00010001 , 0, 0 );
pd(POD_MSU,3); /*POD_MSU Port Driver 3 */
   P3_data_D0 = dr_inc( 0x0aaaaaa0, 0x00010001 );
   P3_stat_D0 = msu_inc_data_stat( 0x0aaaaaa0, 0x00010001 , 0, 0 );
   P3_data_D1 = dr_inc( 0x0bbbbbb0, 0x00010001 );
   P3_stat_D1 = msu_inc_data_stat( 0x0bbbbbb0, 0x00010001 , 0, 0 );
   P3_data_D2 = dr_inc( 0x0cccccc0, 0x00010001 );
   P3_stat_D2 = msu_inc_data_stat( 0x0cccccc0, 0x00010001 , 0, 0 );

/*------------------------------------------------------------------ */
/* Port Driver  mask initialization */
/*------------------------------------------------------------------ */ pd(POD_MSU,0); /*POD_MSU Port Driver 0 */
   P0_mask_M0 = mr( 0xffffffff, 0xffffffff,
```

FIG. 8D

```
           0xffffffff, 0xffffffff, 0xffffffff, 0xffffffff,
                   0xffffffff, 0xffffffff, 0xffffffff, 0xffffffff,
                   0xffffffff, 0xffffffff, 0xffffffff, 0xffffffff,
                   0xffffffff, 0xffffffff, 0xffffffff, 0xffffffff);
 pd(POD_MSU,1); /*POD_MSU Port Driver 1 */
    P1_mask_M0 = mr( 0xffffffff, 0xffffffff,
           0xffffffff, 0xffffffff, 0xffffffff, 0xffffffff,
           0xffffffff, 0xffffffff, 0xffffffff, 0xffffffff,
           0xffffffff, 0xffffffff, 0xffffffff, 0xffffffff,
           0xffffffff, 0xffffffff, 0xffffffff, 0xffffffff);
 pd(POD_MSU,2); /*POD_MSU Port Driver 2 */
    P2_mask_M0 = mr( 0xffffffff, 0xffffffff,
           0xffffffff, 0xffffffff, 0xffffffff, 0xffffffff,
           0xffffffff, 0xffffffff, 0xffffffff, 0xffffffff,
           0xffffffff, 0xffffffff, 0xffffffff, 0xffffffff,
           0xffffffff, 0xffffffff, 0xffffffff, 0xffffffff);
 pd(POD_MSU,3); /*POD_MSU Port Driver 3 */
    P3_mask_M0 = mr( 0xffffffff, 0xffffffff,
           0xffffffff, 0xffffffff, 0xffffffff, 0xffffffff,
           0xffffffff, 0xffffffff, 0xffffffff, 0xffffffff,
           0xffffffff, 0xffffffff, 0xffffffff, 0xffffffff,
           0xffffffff, 0xffffffff, 0xffffffff, 0xffffffff);

/*----------------------------------------------------------------- */
/* Start up Run Control Port Driver (RCPD) with all PPDs active */
/*----------------------------------------------------------------- */
pd(RCPD,0);
      rcpd_start_pd(0xf);

pd(POD_MSU, 0) ;
 pd_resp(TYPE1,0,1,0,0x0) ;
 fa_fetch(FOXX, 1, 0, 0, 0, 0x000, 0x0a0, 0, 0, 0, P0_data_D0) ;
pd(POD_MSU, 1) ;
   pd_hjmp_mask(0x0);
pd(POD_MSU, 2) ;
   pd_hjmp_mask(0x0);
pd(POD_MSU, 3) ;
   pd_hjmp_mask(0x0);
pd(POD_MSU, 0) ;
   fa_diag_dirstate(FETCH, 1, 0, 0, 0, 0x000, 0x0a0, 0, P0_stat_D0, 0x0) ;
   pd_hjmp_mask(0x0);
pd(RCPD, 0);
   rcpd_resume_pd(0x6, 0xf);
pd(POD_MSU, 1) ;
   pd_resp(TYPE1,0,1,0,0x0) ;
   fa_io(IOOW, 0, 1, 0, 0, 0x000, 0x0a0, 0, 0, 0, P1_data_D1) ;
pd(POD_MSU, 2) ;
   pd_resp(TYPE1,0,1,0,0x0) ;
```

FIG. 8E

```
    fa_fetch(FCXX, 0, 0, 1, 0, 0x000, 0x0b0, 0, 1, 1, P2_data_D1) ;
pd(POD_MSU, 1) ;
 pd_resp(TYPE1,0,1,0,0x0) ;
    fa_fetch(FCXX, 1, 0, 0, 0, 0x000, 0x0a0, 0, 1, 0, P1_data_D0) ;
pd(POD_MSU, 2) ;
 pd_resp(TYPE1,0,1,0,0x0) ;
    fa_fetch(FOXX, 1, 0, 0, 0, 0x000, 0x0a0, 0, 0, 0, P2_data_D0) ;
pd(POD_MSU, 1) ;
   pd_hjmp_mask(0x0);
pd(POD_MSU, 2) ;
   pd_hjmp_mask(0x0);
pd(RCPD, 0);
  rcpd_resume_pd(0xF, 0xf);
pd(POD_MSU, 0) ;
 pd_resp(TYPE1,0,1,0,0x0) ;
    fa_fetch(FCXX, 0, 1, 0, 0, 0x000, 0x0a0, 0, 1, 0, P0_data_D1) ;
pd(POD_MSU, 1) ;
 pd_resp(TYPE1,0,1,0,0x0) ;
    fa_fetch(FCXX, 0, 1, 0, 0, 0x000, 0x0a0, 0, 1, 1, P1_data_D1) ;
pd(POD_MSU, 2) ;
 pd_resp(TYPE1,0,1,0,0x0) ;
    fa_fetch(FCXX, 0, 1, 0, 0, 0x000, 0x0a0, 0, 1, 1, P2_data_D1) ;
pd(POD_MSU, 3) ;
 pd_resp(TYPE1,0,1,0,0x0) ;
    fa_fetch(FCXX, 0, 1, 0, 0, 0x000, 0x0a0, 0, 1, 1, P3_data_D1) ;

/*-------------------------------------------------------------- */
/* Halt Port Drivers */
/*-------------------------------------------------------------- */
pd(RCPD, 0) ;
    rcpd_resume_pd(0xf, 0xf);
    rcpd_halt() ;
pd(POD_MSU, 0) ;
    pd_halt();
pd(POD_MSU, 1) ;
    pd_halt();
pd(POD_MSU, 2) ;
    pd_halt();
pd(POD_MSU, 3) ;
    pd_halt();
/*-------------------------------------------------------------- */
/* Finished Horizon MSU Testcase: test1 */
/*-------------------------------------------------------------- */ close_test() ;
}
```

*FIG. 8F*

METHOD AND APPARATUS FOR EFFICIENTLY GENERATING TEST INPUT FOR A LOGIC SIMULATOR

CROSS-REFERENCE TO RELATED APPLICATIONS

This invention is related to U.S. patent application Ser. No. 09/218,9012, filed Dec. 22, 1998, entitled "Method and Apparatus for Synchronizing Independently Executing Test Lists for Design Verification"; U.S. patent application Ser. No., 09/218,364, filed Dec. 22, 1998, entitled "Test Driver for Use in Validating a Circuit Design"; U.S. patent application Ser. No. 09/219,285, filed Dec. 22, 1998, entitled "Method And Apparatus For Selectively Displaying Signal Values Generated By A Logic Simulator"; U.S. patent application Ser. No. 08/965,004, filed Nov. 5, 1997, entitled "A Directory-Based Cache Coherency System"; U.S. patent application Ser. No. 08/964,606, filed Nov. 5, 1997, entitled "Message Flow Protocol for Avoiding Deadlocks"; U.S. patent application Ser. No. 09/001,588, filed Dec. 31, 1997, entitled "High-speed Memory Storage Unit for a Multiprocessor System Having Integrated Directory and Data Storage Subsystems"; and U.S. patent application Ser. No. 09/001,592, filed Dec. 31, 1997, entitled "High-Performance Modular Memory System with Crossbar Connections", all assigned to the assignee of the present invention and all incorporated herein by reference.

TECHNICAL FIELD

This invention relates to the field of logic simulation of electronic circuits. More specifically, this invention relates to methods and apparatus for efficiently generating test input for a logic simulator.

BACKGROUND OF THE INVENTION

Gordon Moore, the cofounder of Intel Corporation, made an observation and diction that semiconductor performance would double every 18 months, with the price of the new product remaining constant with the old. This observation is now referred to as Moore's Law, and has remained relatively accurate since the early 1970s. Moore's Law illustrates the rapid advancement that has and is taking place in the electronics industry. Because of this rapid advancement, the market window for many electronic products is relatively short, with faster and more powerful devices being continuously introduced. Accordingly, there is often great pressure to reduce the development time for many products. To significantly reduce the development time for most electronic devices, the design time must be reduced, as the design typically consumes a majority of the development cycle.

FIG. 1 shows a typical prior art design process for an ASIC (Application Specific Integrated Circuit) device. ASIC devices are commonly used to implement large and/or high performance circuit designs. In a first step, a hardware architect typically determines the requirements for the circuit design and formulates an underlying framework of the function and projected performance characteristics of the circuit design. The architect documents these ideas in a functional specification. This is shown at step 12 of FIG. 1.

The design is then typically partitioned into a number of blocks and given to one or more logic designers for implementation. The logic designers create a detailed logic design using the functional specification as a guide. Rather than creating schematics, many logic designers express the design in a behavioral language such as VHDL (VHSIC Hardware Description Language), as shown at step 14. Many logic simulation tools can directly accept behavioral language descriptions as input. This not only improves efficiency in developing complex circuit designs, but also allows various sections of the circuit design to be functionally verified before the entire design is complete.

As shown at step 16, the design is typically logically simulated to verify the functionality thereof. To logically simulate the design, the circuit designer typically provides one or more test input files. The test input files may include a number of test conditions often expressed as test vectors. Each of the test vectors may include a value for selected inputs of the circuit design along with an expected circuit response. The logic simulator reads the test input files, simulates the behavior of the circuit design using the test input, and provides a simulated circuit response. The simulated circuit response is then compared to the expected circuit response to determine if the circuit design provides the expected behavior.

To increase the speed of the logic simulator, a test driver may be provided. A test driver typically includes a memory structure or the like that is expressed in a behavioral language description, and is logically connected to the inputs of the circuit design. Prior to simulation, the memory structure of the test driver is loaded with data to control the inputs of the circuit design during logic simulation. For example, data may be loaded into a RAM structure within the test driver, and during logic simulation, the address to the RAM structure may be incremented to provide each of the test vectors to the inputs of the circuit design. The test driver, thus is simulated along with the circuit design. The use of a test driver may increase the speed of the logic simulation by allowing the simulation kernel of the logic simulation tool to run continuously for a longer period of time.

When a test driver is not used, the simulation kernel typically must be interrupted whenever new test vectors are applied. That is, without a test driver, each test vector must typically be applied via a simulation control program. Control must typically be passed between the simulation kernel and the simulation control program for each test vector to be applied. Because the simulation kernel must be continuously interrupted, the efficiency of the logic simulator is often reduced.

After logic simulation is complete, the design is typically passed to one or more physical designers, as shown at step 18. The physical designers place the various cells that represent the basic logic building blocks of the circuit design, and interconnect the cells using a routing tool. Timing information may be extracted and analyzed by both the physical and logical designers. Some timing problems can be fixed by the physical designer by adjusting the drive strengths of various components or placing cells in a different arrangement relative to each other. As shown at step 22, other timing problems can only be resolved by modifying the logic itself. If a problem is resolved by modifying the logic, the modified design must typically be reverified by re-executing logic simulation step 16 and then the physical design step 18.

As shown at step 24, after all the logical and physical changes are made, and the design meets the stated requirements, the design is released for fabrication. For a typical ASIC device, fabrication can take several months. Once completed, the device is returned and tested, as shown at step 26. If the device does not meet the stated requirements, a design modification may be required as shown at step 22, forcing another design iteration of the logic simulation step 16, the physical design step 18, and the fabrication step 24. The device is again tested to determine if the design meets all of the stated requirements. If the device meets all of the stated requirements, the device is released, as shown at step 30.

In most design processes, it is important to reduce the number of design iterations during the development cycle. Having more than one design iteration can substantially reduce the efficiency of the design process. One way of reducing the number of design iterations is to increase the fault coverage of the logic simulations. Increasing the fault coverage can increase the probability that the design errors will be detected before the design is fabricated. However, increasing the fault coverage increases the time required to generate and simulate the increased number of test cases. Thus, there is often a trade-off between the fault coverage and design cycle time.

FIG. 2 illustrates a prior art logic simulation process. At step 42, the architect and test designer discuss the logic implementation and define a series of test cases that address the various functional sections and possible interactions of the design. In many designs, such as a MSU (Main Storage Unit) design with multiple parallel ports and crossbar switches (see below), there are many possible functional operations and interactions that should be tested. Thus, a large number of test cases are often required to achieve a high level of fault coverage.

For some of the test cases, the test designer can easily define the relevant test parameters. However, for many test cases, such as those that test parallel operating hardware, the test designer must use a certain level of parallel thinking and thus are much more difficult. A test case that simulates the interaction of two parallel operating ports of a circuit design, where the operation of one port must be choreographed with the operation of another port, is an example of a more complex test case. Defining such a test can require a significant amount of parallel thinking, and thus can be relatively difficult and time consuming.

Once the test cases are defined, the test designer typically codes the test cases into a format that can be used to produce an input for the logic simulator. The test designers may, for example, code the test cases into a format that can be readily read by a logic simulator to control the logic simulation. This format may include, for example, a force command, followed by a run command, followed by a force command, etc. This format is particularly suitable when a test driver is not used to control the inputs of the circuit design.

When a test driver is used, however, the test cases may be coded into a standard programming language like "C", as shown at step 44. When executed, the "C" programs may generate a series of data files that can be loaded into memory structures within the test driver, as shown at step 46. The "C" programs may also generate corresponding initialization files that can be loaded into the device under test (MSU RAMS). During simulation, a series of load commands may be executed by the simulation control program. These load commands may load the data and initialization files into the array structures that represent the simulation models of the appropriate memory structures (e.g. RAMs). Clocks are then issued (simulation starts) and the test is performed as shown at 48.

At the end of the logic simulation, the results are checked to see if the test passed or failed, as shown at step 50. If the test failed, the results are analyzed to determine whether there was a test problem or an actual logic design problem, as shown at step 52. If a test problem is detected, the test is modified and re-executed as shown at step 56. If a logic problem exists, the logic design must be modified, as shown at step 54, and the logic simulations are re-executed to validate the change. When all of the defined test cases pass, as shown at step 58, the logic simulation process is complete.

One limitation of the above-described logic simulation process is that the process of defining and mapping the parallel algorithms into a serial type format such as the "C" programming language can be difficult and time consuming. The serial constructs of a standard programming language typically do not readily lend themselves to the parallel nature of many test cases. Thus, it is often difficult to quickly identify which test conditions associated with one circuit section correspond to the test conditions associated with another circuit section. Under many circumstances, the test designer must scroll up through the serial program code and manually identify which values are associated with one another.

As can readily be seen, considerable effort may be required to ensure that the serial implementation, such as the serial constructs of the "C" programming language, actually implement the desired parallel test case. In addition, the rigid syntax requirements of many standard programming languages can make it difficult to efficiently code the desired test cases.

The above limitations are magnified because the test designer must typically define and map a large number of test cases to achieve an adequate fault coverage for the logic simulation process. Because of the difficulty in defining and mapping the test cases, as described above, and because a large number of test cases are typically required, the logic simulation process can be the longest and most labor intensive part of the design process. Therefore, even a small increase in the efficiency of the logic simulation process, and in particular the test case definition and mapping process, may significantly improve the efficiency of the overall design process.

SUMMARY OF THE INVENTION

The present invention overcomes many of the disadvantages of the prior art by providing an improved method and apparatus for generating test input for a logic simulator. Generally, the present invention provides a template that allows a test designer to more efficiently enter the desired test conditions. The template is preferably arranged to facilitate the definition of test cases, and in particular, parallel type test cases. In an illustrative embodiment, one region of the template is dedicated to one section of the circuit design, and another region is dedicated to another section of the circuit design. When the regions are positioned side-by-side, for example, the test designer can easily identify the test conditions that are applied to the various circuit sections, including the relationships therebetween. Once the test conditions are entered, the template is processed and the desired test input is automatically generated.

In accordance with one illustrative embodiment of the present invention, the template is logically divided into a number of regions, wherein each of the regions corresponds to a different section of the circuit design. The circuit designer enters a number of test conditions into the template by providing a first portion of a selected test condition in a first one of the regions and a second portion of the selected test conditions in a second one of the regions. When the first and second regions are placed side-by-side, for example, the user can easily see which test conditions are applied to the various circuit sections and the relationship therebetween.

Once the desired test conditions are entered into the template, a processor or the like processes the template and provides a test input for the logic simulator. The processor may, for example, read the test conditions from the template and automatically code the test conditions into a format that can be readily read by a logic simulator for controlling the logic simulation. One such format may include, for example, a force command, followed by a run command, followed by a force command, etc. This embodiment may be particularly suitable when a test driver is not used to drive the inputs of the circuit design.

When a test driver is used, the processor may read the test conditions from the template and automatically codes the test conditions into a standard programming language like "C". When executed, the "C" program may generate a series of data files that are capable of being loaded into the test driver. The "C" program may also generate a set of corresponding initialization files that may be loaded into the device-under-test (MSU RAMs), as more fully described below.

An illustrative circuit design may include, for example, a first parallel port and a second parallel port. The test conditions associated with the first parallel port may be provided in the first region of the template. The test conditions associated with the second parallel port may be provided in the second region of the template. Preferably, the template includes a number of columns and a number of rows, wherein the first region and the second region form at least two of the columns, and each test condition (test vector) forms one or more of the rows. In this arrangement, the relationship between the test conditions for each of the circuit sections can be easily visualized by looking at the values in each of the columns within a single or set of rows. Thus, when one of the circuit sections operates in parallel with another circuit section for a particular test case, the circuit designer can easily visualize the parallel nature of the test case.

Some regions of the template may be dedicated to receiving a number of initialization states for selected circuitry including the circuit design. The circuit design may have to be properly initialized before performing some test cases. Other regions of the template may be dedicated to receiving a number of names with corresponding values. The names may be used as aliases or the like to shorten the descriptions of selected test conditions. For example, a test condition that requires a data value of "001001000110011001101" may include an alias or the like that corresponds to the data value, for example D0. Accordingly, the length and apparent complexity of the test condition can be substantially reduced, and the readability of the test condition can be substantially increased.

Preferably, the template is provided via a spreadsheet application program, with various predefined regions corresponding to selected portions of the circuit design. An advantage of using a spreadsheet application program is that the editing functions provided thereby can be used to help input the test conditions into the template.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the Figures thereof and wherein:

FIG. 5 is a listing of a number of illustrative regions in a template in accordance with the present invention;

FIG. 8A–8F show an illustrative "C" output program that is generated by processing the template of FIG. 6.

DETAILED DESCRIPTION OF THE PREFERRED EMBODIMENTS

Figure 1:
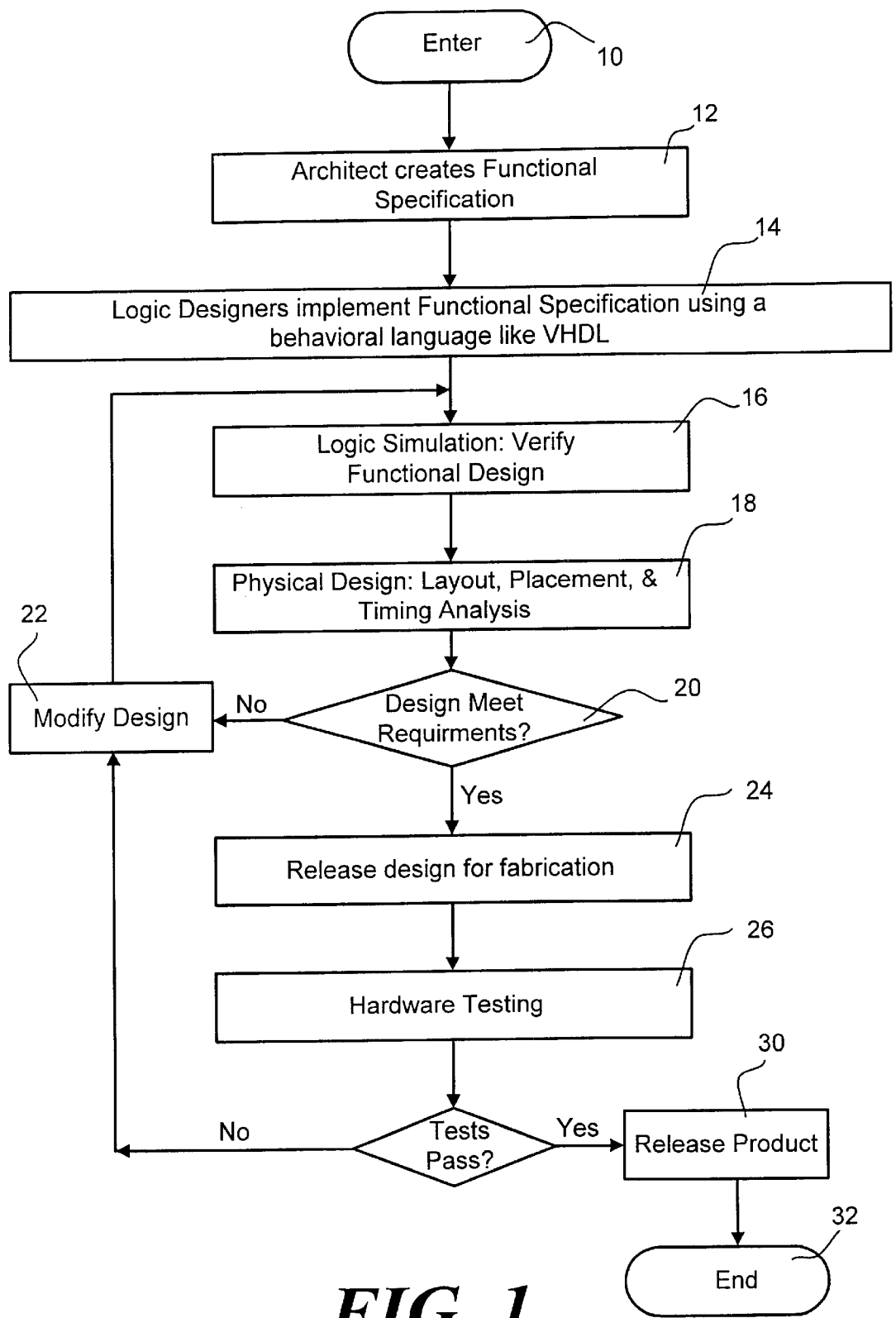
FIG. 1 is a flow diagram showing an illustrative design process in accordance with the prior art.
Figure 2:
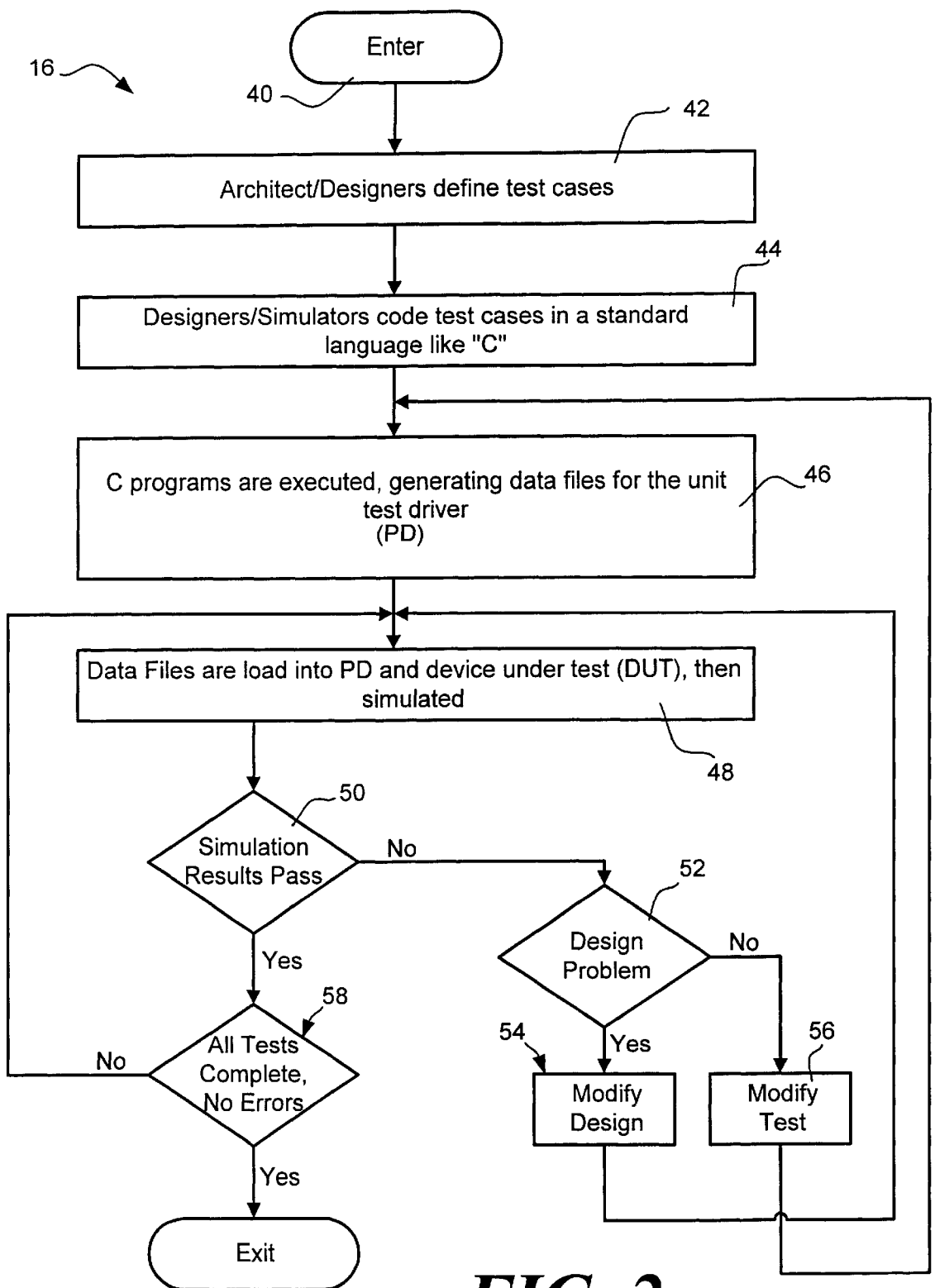
FIG. 2 is a flow diagram showing an illustrative logic simulation process in accordance with the prior art.

The detailed description which follows is presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

The present invention also relates to an apparatus for performing the operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression is input to the computer to control operations therein. It is contemplated that a number of source code expressions, in one of many computer languages, could be utilized to implement several aspects of the present invention. A variety of computer systems can be used to practice the present invention, including, for example, a personal computer, an engineering work station, a hardware simulator, an enterprise server, etc. The present invention, however, is not limited to practice on any one particular computer system, and the selection of a particular computer system can be made for many reasons.

The present invention provides an improved method and apparatus for generating test input for a logic simulator. In an illustrative embodiment, the present invention provides a template that allows a test designer to enter the desired test conditions. The template is preferably arranged to facilitate the definition of the test cases, and in particular, parallel type test cases. For example, one region of the template may be dedicated to one section or block of the circuit design, and another region may be dedicated to another section or block of the circuit design. When the regions are positioned side-by-side, for example, the test designer can then easily identify the test conditions that are applied to the various circuit sections or blocks, including the relationships therebetween. Once the test conditions are entered into the template, the template is preferably processed to automatically generate the desired test input. This may substantially improve the efficiency of the overall design process.

Figure 3:
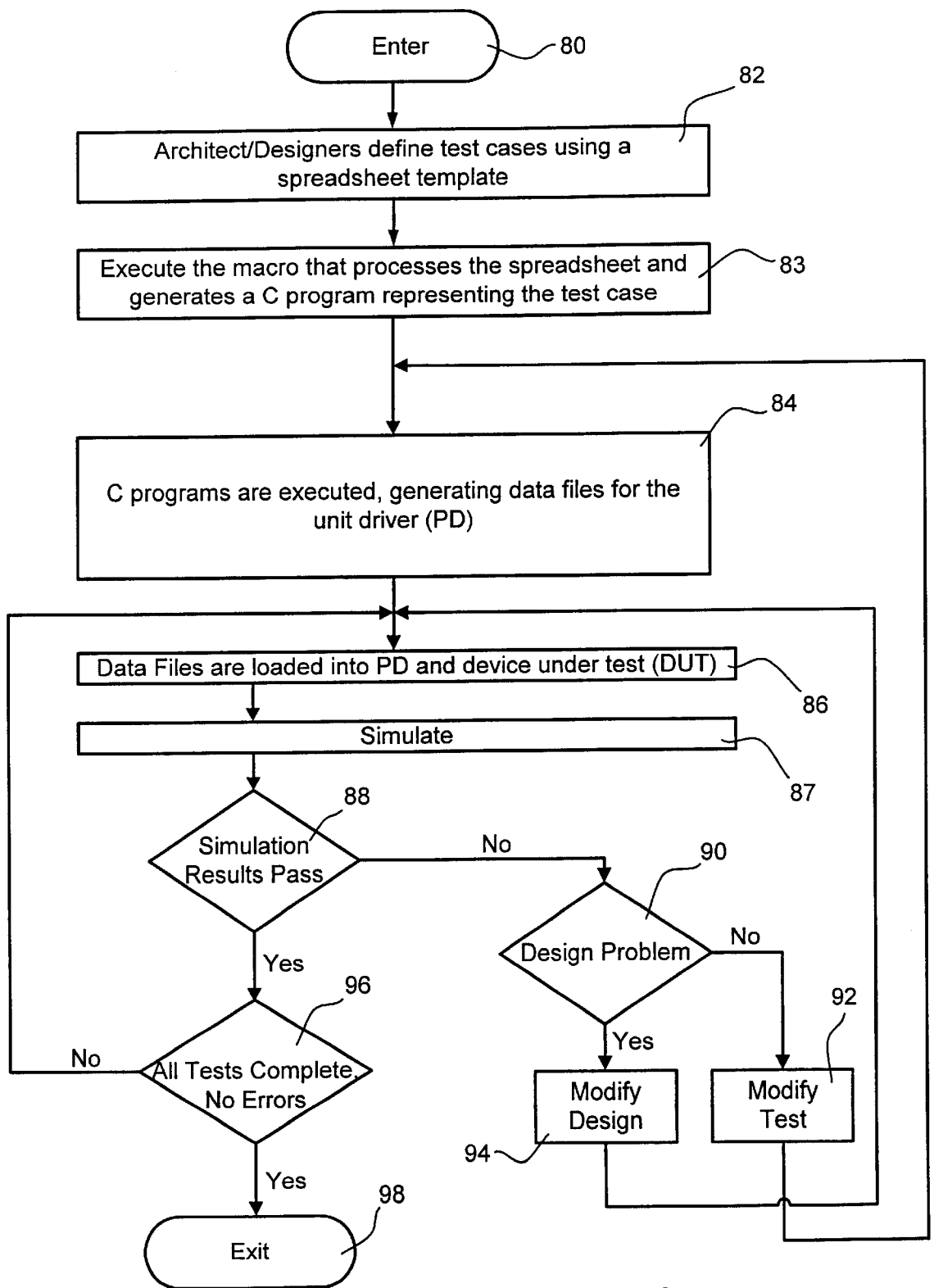
FIG. 3 is a flow diagram showing a design process in accordance with an illustrative embodiment of the present invention.

FIG. 3 shows a flow diagram of an illustrative design process in accordance with the present invention. The design process is entered at step 80. The architect and/or designers define the appropriate test cases using a spreadsheet template, as shown at step 82. The spreadsheet template is preferably similar to that shown and described with reference to FIG. 6 below, and is generated using a modem spreadsheet program such as MicroSoft Excel™. The use of a spreadsheet program may assist the architects and/or designers in generating and/or editing the spreadsheet templates and the test cases provided therein via the cut, paste, and/or editing functions provided therein.

After the test case is defined using the spreadsheet template, a macro is executed using the completed spreadsheet template as input. This is shown at step 83. The macro is preferably a visual basic macro that reads the appropriate information from the spreadsheet template, and generates a "C" program representing the test cases whose parameters are specified in the spreadsheet template.

An advantage of using a spreadsheet template, as described above, is that the designer can specify and visualize the parallelism of a test case more easily. For example, the designer may not have to mentally align a set of test parameters, while at the same time, visualize the overall intent of the test case. Accordingly, the present invention may provide significant savings in the amount of "think time" necessary to generate test cases and maintaining the test cases.

Once the visual basic program generates the "C" programs using the spreadsheet template as input, the "C" programs may be executed as shown at step 84. Executing the "C" programs preferably generates a number of data files for the test drivers, and a number of initialization files for initializing the circuit design. As indicated above, the use of test drivers may increase the speed of the logic simulator by directly providing data to the circuit design via the behavioral language description, rather than continuously interrupting the simulation kernel of the logic simulation tool to provide such data.

With the data files and initialization files generated, the circuit design can be simulated as shown at step 87. During simulation, a series of load commands may be executed by the simulation control program. These load commands may load the data files and initialization files into the array structures that represent the simulation models of the appropriate memory structures (e.g. RAMs). Clocks are then issued (simulation starts) and the test case is simulated.

At the end of the simulation, the results are checked to see if the test passed or failed, as shown at step 88. If the test failed, the results are analyzed to determine whether there was a test problem or an actual logic design problem, as shown at step 90. If a test problem is detected, the test is modified and re-executed as shown at step 92. If a logic problem exists, the logic design must be modified, as shown at step 94, and the logic simulations must be re-executed to validate the change. When all of the defined test cases pass, as shown at step 96, the logic simulation process is complete.

Figure 4:
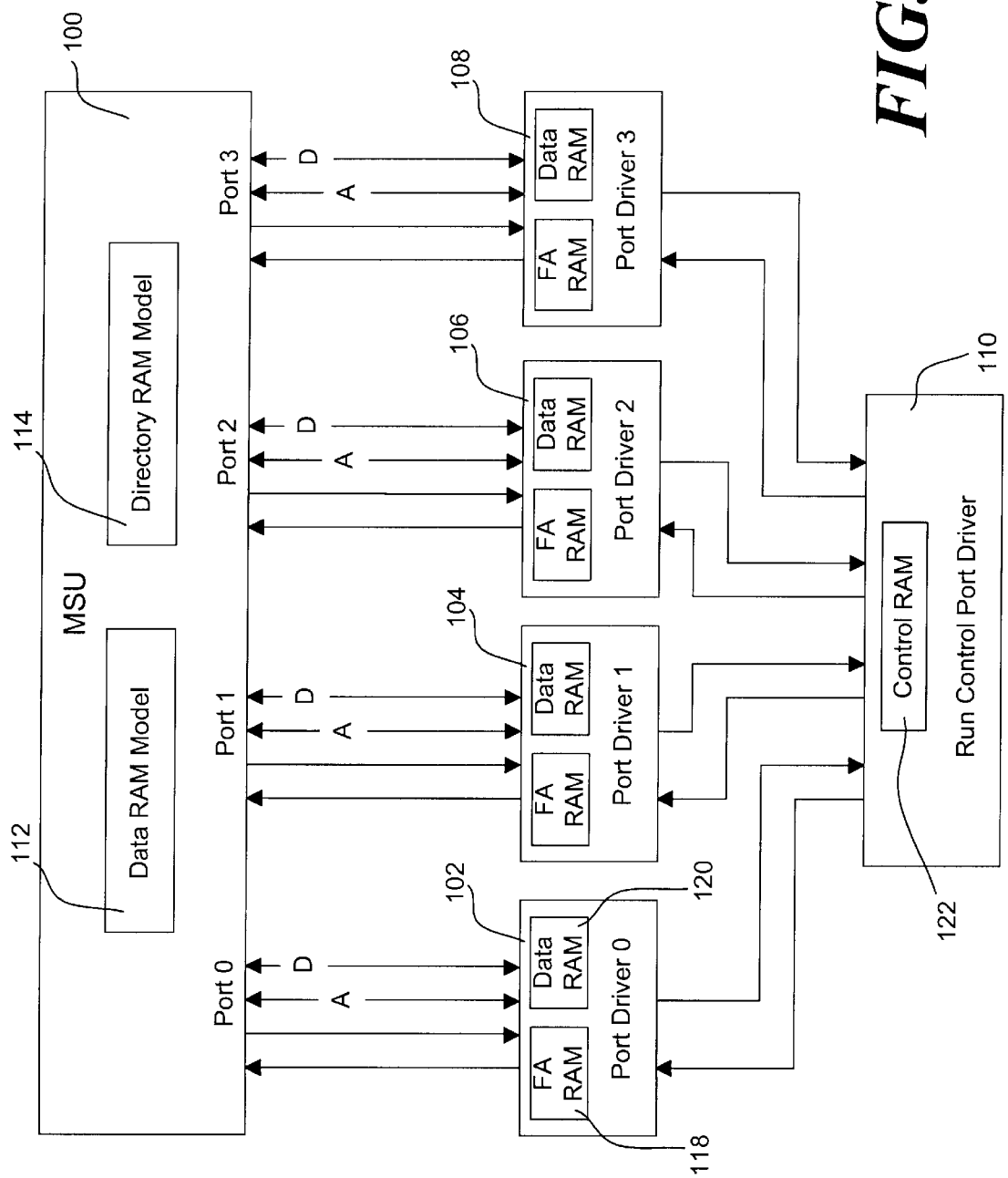
FIG. 4 is a block diagram of an illustrative circuit design including an MSU Main Storage Unit), four port drivers and a run control driver.

FIG. 4 is a block diagram of an illustrative circuit design that includes an MSU (Main Storage Unit) 100, four port drivers 102, 104, 106 and 108, and a run control driver 110. There are three main types of entities in this diagram. The first is the four port MSU 100 that represents the device-under-test or circuit design. The second is the Port Drivers, for example Port Driver 102, that drives and receives the inputs/outputs of the MSU 100. The third is the Run Control Port Driver 110. The Run Control Port Driver controls the synchronization of the test cases that are being executed by each of the four Port Drivers 102, 104, 106 and 108. The four port drivers 102, 104, 106, and 108, and the run control driver 110 are test drivers, as described above.

In the illustrative circuit design, the MSU 100 has two types of RAM (Random Access Memory) models. One is the Data RAM Model 112 and the other is the Directory RAM Model 114. The Data RAM model 112 contains the cache line information that is transferred to and from the MSU via the Data lines connected to the four ports. The Directory RAM model 114 contains the state information for each cache line in the Data Ram Model 112. Both of the RAM Models are initially loaded with information from data files just prior to simulation. The information for these data files is specified in the spreadsheet template, as described more fully below. A further discussion of MSU 100 can be found in U.S. patent application Ser. No. 08/965,004, filed Nov. 5, 1997, entitled "A Directory-Based Cache Coherency System"; U.S. patent application Ser. No. 08/964,606, filed Nov. 5, 1997, entitled "Message Flow Protocol for Avoiding Deadlocks"; U.S. patent application Ser. No. 09/001,598, filed Dec. 31, 1997, entitled "High-speed Memory Storage Unit for a Multiprocessor System Having Integrated Directory and Data Storage Subsystems"; and U.S. patent application Ser. No. 09/001,592, filed Dec. 31, 1997, entitled "High-Performance Modular Memory System with Crossbar Connections".

The four Port Drivers 102, 104, 106 and 108 provide test vectors such as Command, Address and Data to the MSU 100. The Port Drivers also verify the response from the MSU 100. The Port Drivers preferably verify both the data returned by the MSU 100 as a result of executing a command, and the control signals provided by the MSU 100 that control the transfer mechanisms.

The Port Drivers 102, 104, 106 and 108 each contains two RAM Models, including an FA RAM model and a Data RAM model. The FA RAM model, for example FA RAM model 118, is preferably loaded with lists of instructions that represent the test case for a particular MSU port. The data files that contained the compiled lists of instructions are preferably generated by the C programs, that were in turn derived by the parameters in the spreadsheet template.

The Data RAM model 120 of Port Driver 102, for example, preferably contains both the data information that is used to drive the data lines to the MSU 100, and the compare data information that is used to verify the read data that is returned from the MSU 100 in response to, for example, a fetch command. The Data RAM model 120 is preferably loaded from data files generated by the C programs.

The Run Control Port Driver (RCPD) 110 coordinates the execution of the instructions in the four port drivers 102, 104, 106 and 108. For example, the RCPD 110 may start one port driver, while leaving the other three in a halted state; or start all four port drivers simultaneously. The test case will, of course, dictate the order and sequence of the execution of the port drivers. The RCPD 110 operates under program control based on the instructions loaded in Control RAM 122 prior to simulation. The compiled instructions are located in files that are generated by the above-referenced C programs. Preferably, the RCPD instructions are automatically generated by using the position of the Port Driver commands within the spreadsheet template. As shown and described with reference to FIG. 6, the relative relationship between the port driver commands can be identified by examining the various rows and columns in the spreadsheet template.

FIG. 5 is a listing of a number of illustrative regions in an illustrative spreadsheet template in accordance with the present invention. The spreadsheet template is divided into eight main regions, with each region marked by a header phrase followed by a colon":". The eight regions in the illustrative template include a Header region, a Description region, a Revision History region, a MSU Address region, a MSU Data Increment region, a PD Mask Ditto region, a MSU Response region, and a Test region. An illustrative spreadsheet template including each of these regions is shown and described below with respect to FIG. 6.

Figure 6:
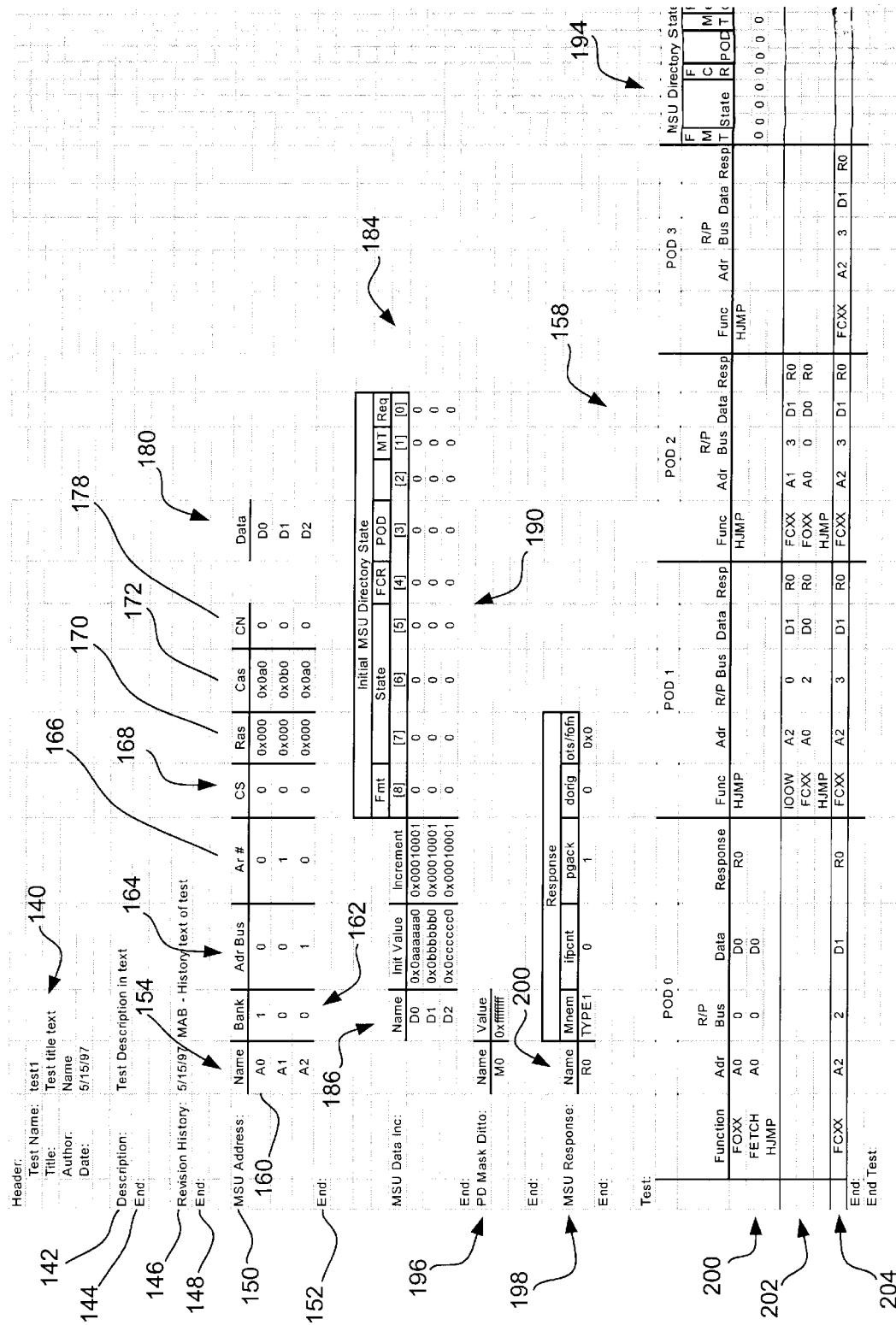
FIG. 6 is a diagram of an illustrative template for the circuit design of FIG. 4, using the illustrative regions of FIG. 5.

FIG. 6 is a diagram of an illustrative spreadsheet template that corresponds to the circuit design of FIG. 4, while using the illustrative regions of FIG. 5. The Header area is a fixed size area and is mainly used for text comments that are later inserted in the "C" code to identify the test name, title, author, and date. The test name is also used in creating the filename of the file that contains the generated "C" code.

The Description area is a variable length area that resides between the "Description:" marker 142 and the first "End:" marker 144. It contains text that is transferred as comments into the "C" code. These comments are use to describe what the purpose of the test is and any other pertinent comments about the test.

The Revision History area is also a variable length area that resides between the "Revision History:" marker 146 and the next "End:" marker 148. This area is also transferred as comments into the "C" code. Text placed here is used to track date and change information.

The MSU Address area is also a variable length area that resides between the "MSU Address:" marker 150 and the "End:" marker 152. The MSU address area is used to defined the meaning of various address symbols, located under the Name column 154, that will be used later in the "Test:" area 158 of the spreadsheet template. The address symbol, for example address symbol A0 160, provides for a compact representation of an address that may be required by each of the four port drivers. The name A0 is the symbol that represents the set of address fields specified in the Bank column 162, the Adr# Bus column 164, the Ar# column 166, the CS column 168, the Ras column 170, the Cas column 172, and the CN column 178. These field columns are used to specify the various address routing logical areas of the MSU under test. A further discussion of the operation of the MSU 100 can be found in U.S. patent application Ser. No. 08/965,004, filed Nov. 5, 1997, entitled "A Directory-Based Cache Coherency System"; U.S. patent application Ser. No. 08/964,606, filed Nov. 5, 1997, entitled "Message Flow Protocol for Avoiding Deadlocks"; U.S. patent application Ser. No. 09/001,598, filed Dec. 31, 1997, entitled "High-speed Memory Storage Unit for a Multiprocessor System Having Integrated Directory and Data Storage Subsystems"; and U.S. patent application Ser. No. 09/001,592, filed Dec. 31, 1997, entitled "High-Performance Modular Memory System with Crossbar Connections".

The data column 180 specifies a symbol that represents data that is defined in the MSU Data Inc area, and that will be used to initialize the MSU Data RAM Model 112 and Directory RAM Model 114 for the associated address specified in the address fields. For example, the symbol "A0" represents an address that uses bank 0, Adr Bus 0, AR 0, Chip Select 0 (CS), Ras Address $000_H$ and Cas Address $0i_a0_H$ and container 0 (CN), of the MSU. This particular location will be initialized by Data represented by D0, which is defined in the "MSU Data Inc:" region 184. As can be seen in the illustrative test, two other addresses are defined, A1 and A2, both of which are initialized with different data represented by "D1" and "D2", respectively.

The MSU Data Inc area 184 defines the data pattern that is associated with the Data symbol whose name is specified in the "Name" column 186. Each data symbol represents a cache line of information. A cache line is specified as 64 bytes of information, and is the unit of transfer between the MSU and the Port Drivers. In the illustrative table, the 64 bytes are defined by specifying a four byte initial value followed by a four byte increment value. Therefore, not all data values need to be specified but can be generated by the program. What is most important in memory testing is not the actual data value itself but that each datum can be uniquely identified. Then, if there is a logic error, the error will manifest itself as a routing error or create a datum that does not match the expected datum. These cache lines as represented by the symbol names under the Name column 186 are used for initialization and for comparing data values.

The Initial MSU Directory State columns, generally shown at 190, are used to specify data that is to be loaded into the MSU Directory RAM Model 114. The values in the MSU Directory RAM model 114 are also modified by the MSU during simulation. Further, there are commands that allow this directory information to be transmitted to the port driver for verification. The port driver may verify the received information against the expected values specified in the MSU Directory State table 194 in the Test Area 158.

The PD Mask Ditto area 196 is where a data mask may be defined. The Port Driver (PD) has the ability to mask out certain data bits as specified by the Mask when it does a compare of received data versus expected data.

The MSU Response area 198 defines the various responses that are expected to be received from the MSU and maps them to a symbol that is listed in the Name column 200.

Finally, the Test Area 158 defines the test cases. In the illustrative diagram, the test area 158 includes five main areas, one for each of four port drivers 102, 104, 106 and 108 (labeled as POD 0 through POD 3), and one for the MSU Directory State Table 194. Each of the port driver regions includes five main fields: Function; Address (Adr); R/P Bus; Data; and Response. Each port driver has the capability of executing various types of commands. Some of the commands are strictly port driver control commands, and others are commands that are used to be issued and interpreted by the MSU 100.

In the illustrative spreadsheet template, there are three separate test cases defined. The first test case 200 directs Port Driver-0 102 to fetch data from the MSU (FOXX) at address A0, and compare the data received with the value specified by label "D0", which also happens to be the same value that was initially loaded into the MSU 100 at address "A0". The first test case 200 also compares the response received with that specified by "R0". Port Driver-0 102 retrieves the directory state information (FETCH) for address "A0" and compares the value returned with the value stated in the columns under the MSU Directory State. Finally, the first test case 200 halts until the RCPD tells it to continue. During the first test case 200, Port Drivers 1–3 remain idle.

The second test case 202 is executed when the RCPD has detected that all four port drivers have halted and no outstanding jobs remain. At this time, the RCPD 110 starts up Port Driver-1 104 and Port Driver-2 106, as they have functions specified in the second test case 202. That is, the visual basic macro that processes the spreadsheet template may infer from the information specified in the spreadsheet template that the RCPD needs to start up Port Drivers 1 and 2. More specifically, the RCPD can be controlled by the relative position of the instructions rather than specifically stated instructions as required by other programming language like the C programming language.

The second test case 202 directs Port Driver-1 104 to issue an I/0 write (IOOW) command using address A2 and data D1, and expect to see a response R0. Port Driver-1 104 is then directed to issue a fetch command (FCXX) using address A0 and verify the data received with the value specified for D0 and a response of R0, then halt. Port Driver-2 106, on the other hand, issues a fetch copy (FCXX) followed by a fetch original (FOXX), comparing its specified data and response values.

When the second test case 202 is complete, the RCPD starts up all four Port Drivers to execute the third test case 204. During the third test case 204, each Port Driver 102, 104, 106 and 108 fetches the data (as modified in the second test case 202) from the MSU 100. Each Port Driver then compares the results against "D1" and "R0". The third test case 204 is an example of a test case that executes all four port drivers in parallel.

An advantage of the present invention is that all three test cases can be represented on one sheet of paper in a very condense, highly efficient, and easy to understand format. The parallelism is easy to pick out and comprehend. In contrast, FIGS. 8A–8F show the same three test cases using the "C" programming language, wherein six sheets of paper are required to specify the same three test cases. Further, because the "C" programming language is written in a linear format, the parallelism of the test cases is not easily visualized or understood.

Figure 7A:
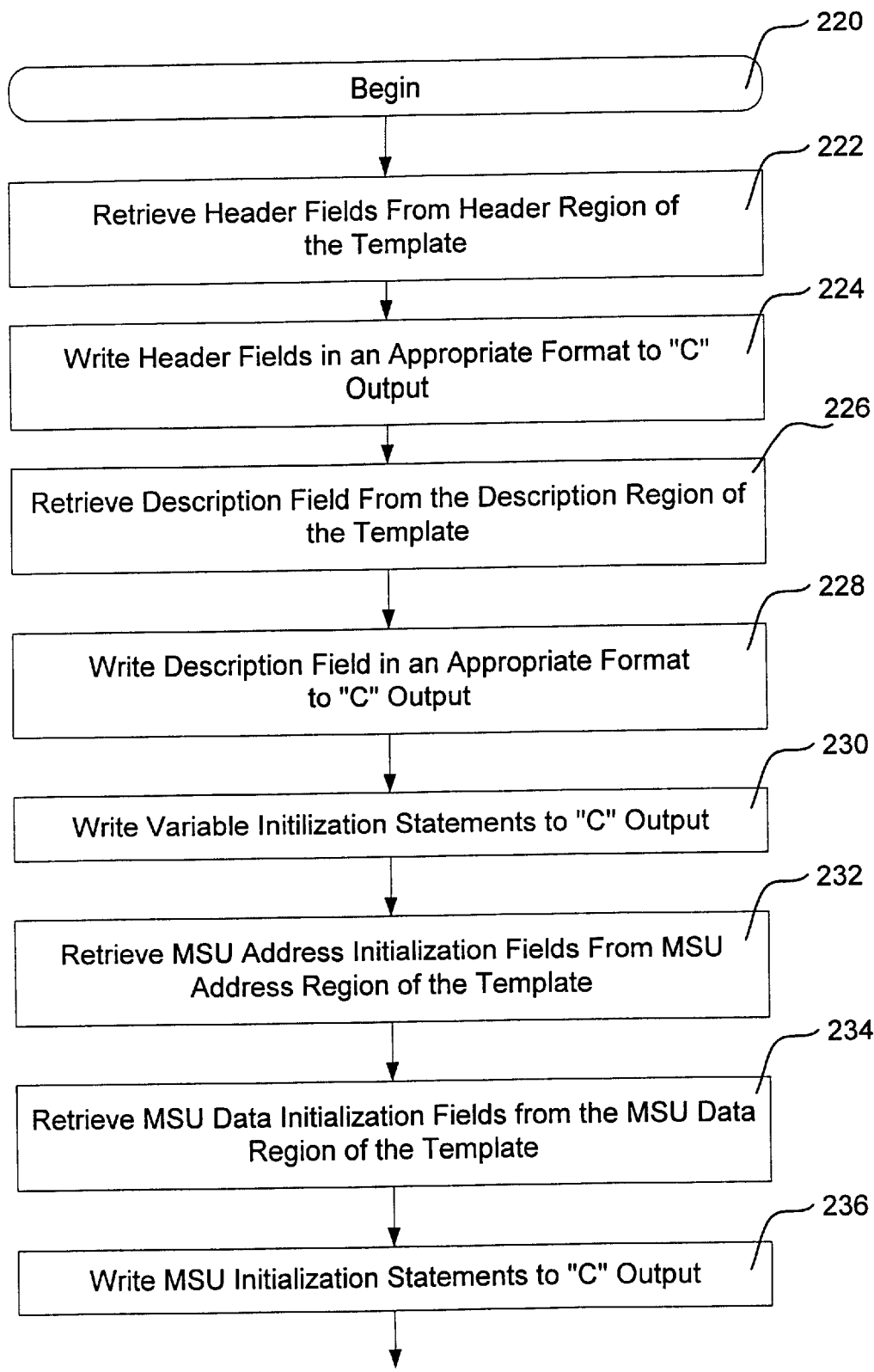
FIG. 7A–7B show a flow diagram of an illustrating processing step for processing the template of FIG. 6 to provide the "C" output program of FIG. 8A–8F.
Figure 7B:
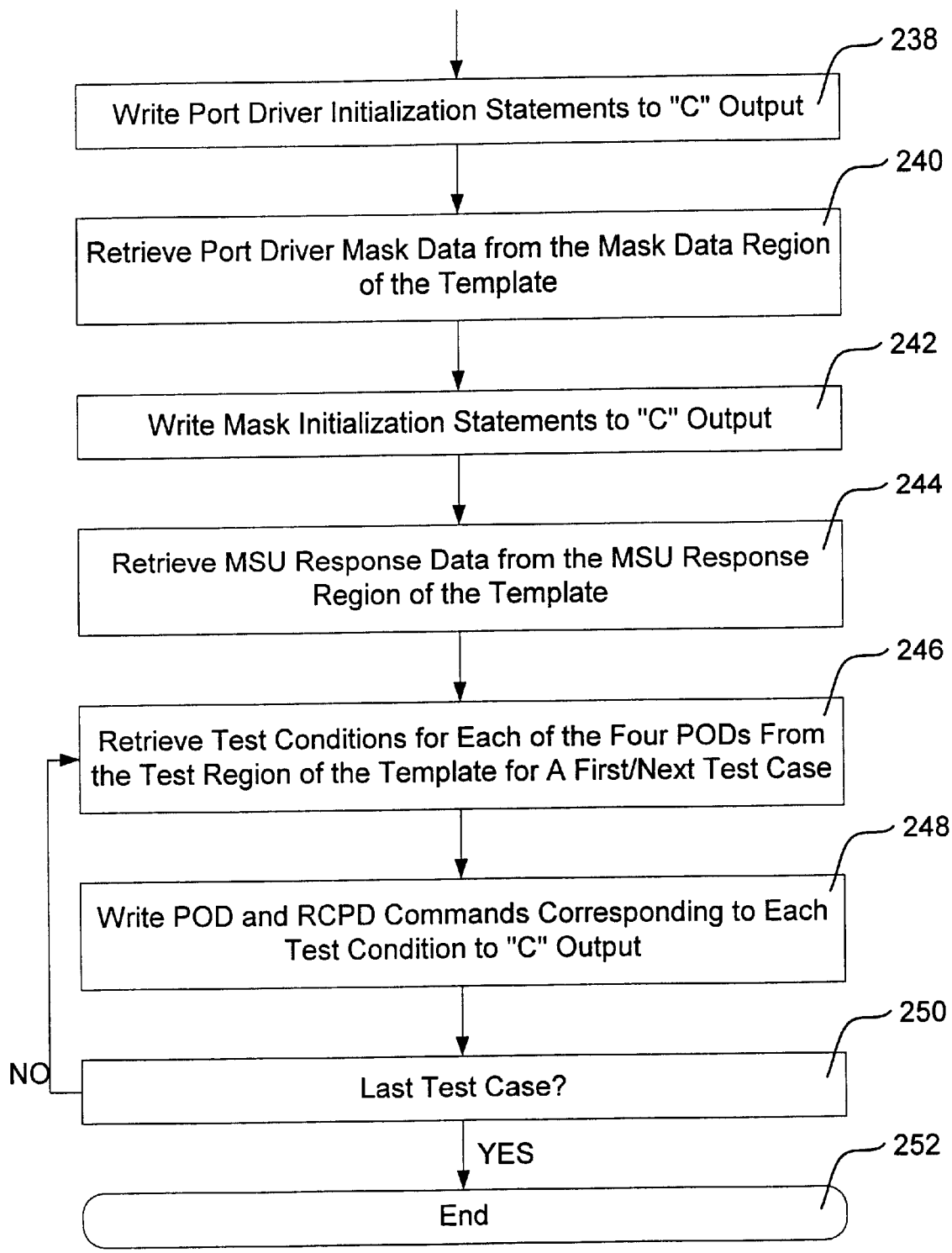

FIG. 7A–7B show a flow diagram of an illustrating processing step for processing the spreadsheet template of FIG. 6 to provide the "C" output program of FIG. 8A–8F. Preferably, the processing step is performed by a visual basic program running on a personal computer. The algorithm is entered at step 220, wherein control is passed to step 222. Step 222 retrieves the header fields from the header region of the spreadsheet template. For example, step 222 may retrieve the header fields from the header region 140 of the spreadsheet template of FIG. 6. Step 224 then writes the header fields in an appropriate format to the "C" program output. Control is then passed to step 226.

Step 226 retrieves the description fields from the description region of the spreadsheet template. For example, step 226 may retrieve the description fields from the description region 142 of the spreadsheet template of FIG. 6. Step 228 then writes the description fields in an appropriate format to the "C" program output. Control is then passed to step 230.

Step 230 writes variable initialization statements to the "C" program output. The initialization statements are automatically generated by the visual basic program and are dependent on the specific circuit design. For example, the initialization statements may define the necessary variables to represent selected circuit elements or busses in the circuit design. Control is then passed to step 234. Step 234 retrieves the MSU Data Initialization Fields from the MSU Data region of the spreadsheet template. This includes both the MSU Data RAM Model 112 and the MSU Directory RAM Model 114. For example, step 234 may retrieve the MSU Data Initialization Fields from the MSU Data region 184 of the spreadsheet template of FIG. 6. Step 236 writes the MSU initialization Statements to the "C" program output. Control is then passed to step 238. Step 238 writes the port driver initialization statements to the "C" program output. This includes both the FA RAM Model 118 and the Data RAM model 120. Control is then passed to step 240.

Step 240 retrieves the port driver mask data from the mask data region of the spreadsheet template. For example, step 240 may retrieve the port driver mask data from the mask data region 196 of the spreadsheet template of FIG. 6. Control is them passed to step 242. Step 242 writes the mask initialization statements to the "C" program output. Control is then passed to step 244.

Step 244 retrieves the MSU Response Data from the MSU response region of the spreadsheet template. For example, step 244 may retrieve the MSU Response Data from the MSU response region 198 of the spreadsheet template of FIG. 6. Control is then passed to step 246.

Step 246 retrieves the test conditions for each of the four Port Drivers from the test region of the spreadsheet template for a first/next test case. For example, step 246 may retrieve the first test case for each of the four Port Drivers from the first test region 200 of the spreadsheet template of FIG. 6. Control is then passed to step 248.

Step 248 writes the POD and RCPD commands that correspond to each test condition to the "C" program output. This includes writing the commands for the FA RAM of each POD and the control RAM 122 for the RCPD. Control is then passed to step 250.

Step 250 determines if there are more test cases. If there are more test cases, control is passed back to step 246. If, however, there are no more test cases in the spreadsheet template, control is passed to step 252 wherein the algorithm is exited.

After the spreadsheet template is processed in this manner, a "C" program listing is provided, as shown in FIGS. 8A–8F. Thereafter, the "C" program listing is executed to produce data files that can be loaded into a logic simulator to initialize and control selected logic simulations.

FIG. 8A–8F show an illustrative "C" output program that is generated by processing the template of FIG. 6 using the processing steps of FIGS. 7A–7B. In FIG. 8A, the Header, Description, and Revision History are seen as comments.

The remainder of FIGS. 8A through FIG. 8C are associated with defining variables, one set for each port driver, and the fixed mode switches for each port driver (e.g. init_dut( SOFT, . . . ). These are provided by the visual basic program and are hidden from the test writer, unless the default settings need to be changed. FIG. 8D defines the data values provided by the MSU Data Inc region 186 in the spreadsheet template of FIG. 6, one for each port driver. The mask for each port driver is initialized at the bottom of FIG. 8D through the middle of FIG. 8E, The actual test cases are provided beginning at the middle of FIG. 8E through FIG. 8F. The particular functions that are routed to each port drivers is specified by the command:

pd(POD_MSU, x), where x is the port driver number. The commands necessary to implement the test cases defined in FIG. 6 are included for each of the four port drivers and the RCPD. However, because the "C" program is a linear listing, it is difficult and time consuming to determine which port driver is doing what function, and which parameter corresponds to which function. This tends to extends the time that is required for generating a test case. Accordingly, by providing a spreadsheet template that allows the designer to easily visualize the parallel nature of a test case, the time required to generate each of the test cases may be reduced. Further, the "C" program listing like the one shown in FIGS. 8A–8F can be automatically generated and more easily maintained.

Figure 9:
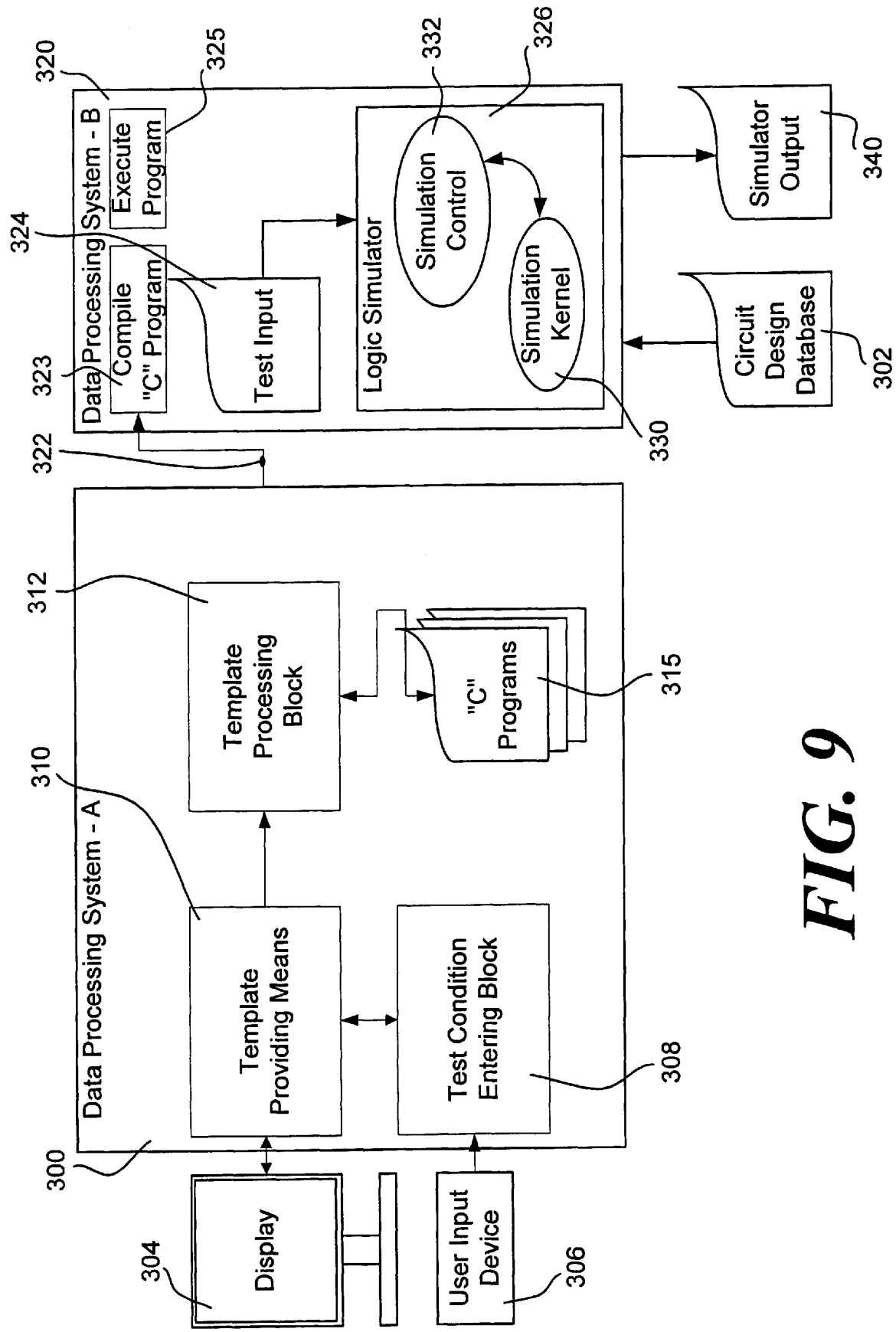
FIG. 9 is a block diagram showing an illustrative data processing system in accordance with the present invention.

FIG. 9 is a block diagram showing an illustrative data processing system in accordance with the present invention. In this embodiment, a first data processing system 300 stores a template that is logically divided into a number of regions. Preferably, each of the regions correspond to a different section or block of the circuit design 302. The template is provided to a display 304 via a template providing means 310. The designer uses a user input device 306 to enter a number of test conditions into the first data processing system 300 via a test condition entering block 308. Preferably, the test conditions are entered into the template by entering a first portion of selected test conditions in a first one of the predefined regions of the template and a second portion of selected test conditions into a second one of the predefined regions, wherein the first predefined region is associated with a first circuit section and the second predefined region is associated with a second circuit section. The test condition entering block 308 integrates the test conditions provided by the designer into the template via the template providing means 310. Because the template is logically divided into a number of regions, the designer can easily visualize the parallel operation of each test case.

After the designer defines the appropriate test cases using the template, the template is provided to the template processing block 312. The template processing block processes the template and provides a "C" program file representing the test. The "C" program is transferred to Data Processing System—B 320 via interface 322. The "C" program is compiled 323, then executed 325, producing Test Input data 324 on Data Processing System—B. The test input may be one or more files that can directly control a logic simulation, or more preferably, one or more files that are loaded into one or more test drivers to control the logic simulation. In the embodiment shown, the template processing block 312 generates a number of "C" files 315. The "C" programs are stored in a memory in the first data processing system 300.

To perform logic simulations, the C Programs 315 are transferred to a second data processing system 320 via interface 322. The "C" programs are compiled and executed on the second data processing system 320 to provide one or more test input files 324. Prior to simulation, the memory structure of one or more. test drivers are preferably loaded with data from the test input files 324 to control the inputs of the circuit design during logic simulation. As indicated above, the use of one or more test drivers may increase the speed of the logic simulation by allowing the simulation kernel 330 of the logic simulation tool 326 to run continuously for a longer period of time. In addition, data from the test input files 324 may be loaded into memory structures within the circuit design itself for initialization. Once loaded, the logic simulator executes a number of simulation steps, and provides the simulation results in a simulator output 340. The test drivers may be used to compare the simulated results with the expected results.

It is recognized that the present invention does not need both a first data processing system 300 and a second data processing system 320. However, in the preferred embodiment, the first data processing system 300 is a personal computer, which allows a number of architects and/or designers to efficiently define test cases while working on their own personal computer. The second data processing system 320 is preferably a high powered data processing system such as an engineering workstation or even a hardware logic simulator. Once the test cases are defined by the architects and/or designers on their personal computers, the test cases are processes and transferred to the high powered second data processing system 320. The high powered second data processing system 320 then reads the test input files, and performs the desired logic simulations.

Having thus described the preferred embodiments of the present invention, those of skill in the art will readily appreciate that yet other embodiments may be made and used within the scope of the claims hereto attached.

What is claimed is:

1. A method for generating a test input representing a number of user defined test conditions for a circuit design having a number of circuit sections, the test input including a number of test conditions that represent logic states that are used by a logic simulator to control one or more nodes of the circuit design when simulating the behavior of the circuit design, the method comprising the steps of:

providing a template for allowing a user to enter a number of test conditions, wherein the template is logically divided into a number of predefined regions;

entering a number of test conditions into the template including providing a first portion of selected test conditions in a first one of the predefined regions and a second portion of selected test conditions in a second one of the predefined regions, wherein the first predefined region is associated with a first circuit section and the second predefined region is associated with a second circuit section; and processing the template to provide the test input to be used by the logic simulator to simulate the behavior of the circuit design.

2. A method according to claim 1, wherein selected ones of the number of circuit sections operate in parallel.

3. A method according to claim 2, wherein selected ones of the number of circuit sections correspond to different ports of a multi-port circuit.

4. A method according to claim 1, wherein the template has a number of columns and a number of rows, wherein each predefined region forms one of the columns and each test condition form one of the rows.

5. A method according to claim 1, wherein the template is provided by a spreadsheet application program.

6. A method according to claim 4, wherein said processing step provides a number of executable programs, wherein the number of executable programs are executed to produce the test input.

7. A method for generating a test input representing a number of user defined test conditions for a circuit design having a number of circuit sections, the test input including a number of test conditions that represent logic states that are used by a logic simulator to control one or more nodes of the circuit design when simulating the behavior of the circuit design, the method comprising the steps of:

provoding a template for allowing a user to enter a number of test conditions, wherein the template is logically divided into a number of predefined regions;

entering a first test condition by providing a first portion of the first test condition in a first one of the predefined regions and a second portion of the first test condition in a second one of the predefined regions, wherein the first portion of the first test condition corresponds to a first one of the circuit sections and the second portion of the first test condition corresponds to a second one of the circuit sections; and processing the first test condition to provide the test input to be used by the logic simulator to simulate the behavior of the circuit design.

8. A method according to claim 7, wherein selected ones of the number of circuit sections operate in parallel.

9. A method according to claim 8, wherein selected ones of the number of circuit sections correspond to different ports of a multi-port circuit.

10. A method according to claim 7, wherein the template is spatially divided into a number of regions.

11. A method according to claim 10, wherein the template has a number of columns and a number of rows, wherein each predefined region forms one of the columns and each test condition form one of the rows.

12. A method according to claim 7, wherein the template is provided by a spreadsheet application program.

13. A method according to claim 12, wherein the spreadsheet application program provides a number of editing functions to help enter the number of test conditions.

14. A method according to claim 7, wherein said processing step provides a number of executable programs, wherein the number of executable programs are executed to produce the test input.

15. A method according to claim 14, wherein the number of executable programs are in the "C" programming language.

16. A method according to claim 7, wherein selected circuit sections include a number of elements that can be initialized.

17. A method according to claim 16, further including the step of entering a number of initial states for the number of elements into one or more of the predefined regions of the template.

18. A method according to claim 7, further including the step of entering a number of names and a corresponding values for each name into one or more of the predefined regions, wherein selected names are used in defining selected test conditions.

19. A method according to claim 7, further comprising the step of:

entering a second test condition by providing a first portion of the second test condition in the first one of the predefined regions and a second portion of the second test condition in the second one of the predefined regions, wherein the first portion of the second test condition corresponds to the first one of the circuit sections and the second portion of the second test condition corresponds to the second one of the circuit sections.

20. A data processing system for generating a test input representing a number of user defined test conditions for a circuit design having a number of circuit sections, the test input including a number of test conditions that represent logic states that are used by a logic simulator to control one or more nodes of the circuit design when simulating the behavior of the circuit design, the data processing system comprising:

providing means for providing a template that is logically divided into a number of predefined regions;

entering means for entering a number of test conditions into said template including entering a first portion of selected test conditions into a first one of the predefined regions and a second portion of selected test conditions into a second one of the predefined regions, wherein the first predefined region is associated with a first circuit section and the second predefined region is associated with a second circuit section; and processing means for processing the template to provide the test input to be used by the logic simulator to simulate the behavior of the circuit design.

* * * * *